(12) United States Patent
Lee

(10) Patent No.: US 11,067,439 B2
(45) Date of Patent: Jul. 20, 2021

(54) PHOTO RECEIVER CIRCUITS

(71) Applicant: Omni Design Technologies Inc., Milpitas, CA (US)

(72) Inventor: Hae-Seung Lee, Lexington, MA (US)

(73) Assignee: Omni Design Technologies Inc., Milpitas, CA (US)

( * ) Notice: Subject to any disclaimer, the term of this patent is extended or adjusted under 35 U.S.C. 154(b) by 176 days.

(21) Appl. No.: 16/275,786

(22) Filed: Feb. 14, 2019

(65) Prior Publication Data

US 2020/0200602 A1    Jun. 25, 2020

Related U.S. Application Data

(60) Provisional application No. 62/783,928, filed on Dec. 21, 2018.

(51) Int. Cl.
*G01J 1/44* (2006.01)
*H03F 3/45* (2006.01)
*H03F 3/68* (2006.01)

(52) U.S. Cl.
CPC ............ *G01J 1/44* (2013.01); *H03F 3/45071* (2013.01); *H03F 3/45188* (2013.01); *H03F 3/68* (2013.01); *G01J 2001/446* (2013.01); *H03F 2200/129* (2013.01); *H03F 2200/69* (2013.01); *H03F 2203/45116* (2013.01); *H03F 2203/45526* (2013.01)

(58) Field of Classification Search
CPC ... G01J 1/44; G01J 2001/446; H03F 3/45071; H03F 3/68; H03F 3/45188; H03F 2203/45526; H03F 2200/129; H03F 2200/69; H03F 2203/45116; H03F 2203/45702; H03F 3/45085; H03F 2203/45138; H03F 3/087; H03F 3/45475
See application file for complete search history.

(56) References Cited

U.S. PATENT DOCUMENTS

| 7,486,322 | B2 * | 2/2009 | Shinotsuka | ............... G01J 1/44 348/308 |
|---|---|---|---|---|
| 9,214,912 | B2 | 12/2015 | Lee | |
| 9,667,194 | B2 | 5/2017 | Lee | |
| 2010/0294918 | A1 * | 11/2010 | Fujii | ......................... G01J 1/44 250/214 A |
| 2016/0061658 | A1 * | 3/2016 | Sugizaki | ................. H03F 1/086 250/551 |

OTHER PUBLICATIONS

Texas Instruments, Inc., "LIDAR Pulsed Time of Flight Reference Design", http://www.ti.com/tool/TIDA-00663 , Jan. 2018, pp. 1-25, Texas Instruments, Inc.

* cited by examiner

*Primary Examiner* — Tony Ko
(74) *Attorney, Agent, or Firm* — Intrinsic Law Corp.

(57) ABSTRACT

Photo receiver circuits comprising photo diode, a first amplifier, a second amplifier, and a feedback resistor are disclosed. The photo diode receives a light signal producing a photo current and the circuit produces an output voltage proportional to the photo current. In one example, the second amplifier coupled across the photo diode provides a voltage level shift between the input terminal and the output terminal, bootstrapping the parasitic capacitance out.

21 Claims, 10 Drawing Sheets

US 11,067,439 B2

PHOTO RECEIVER CIRCUITS

RELATED APPLICATIONS

This application claims priority to U.S. Provisional Application No. 62/783,928, entitled "Photo Receiver Circuits," filed on Dec. 21, 2018, which is hereby incorporated by reference.

TECHNICAL FIELD

The present application is directed to photo receiver circuits that provide higher signal bandwidth and lower noise than conventional circuits.

BACKGROUND

Photo receiver circuits are widely used in fiber optic communication systems and lidar systems to convert a received light signal into a voltage signal for subsequent processing. Transimpedance amplifiers (TIA) based on an operational amplifier (op amp) with a feedback resistor have been used as a front end of a photo receiver circuit. However, conventional photo receivers have limitations and drawbacks. For example, due to the presence of various parasitic capacitances, the signal bandwidth and the noise of the circuit can be compromised.

Examples of prior photo receiver circuits are shown in FIGS. 1 and 2, which will be referenced further below. FIG. 1 illustrates a conventional photo receiver circuit 100 that converts the photo current from a photodiode 110 into a voltage signal. FIG. 2 illustrates prior art photo receiver circuit 200 with a transimpedance amplifier 201 and employing an opamp 230. These conventional circuits will be referenced further below, and have certain limitations known to those skilled in the art, some or all such limitations are overcome by the present invention.

SUMMARY

One embodiment is directed to a photo receiver circuit comprising a photo diode, a first amplifier having an input terminal and an output terminal, a second amplifier having an input terminal and an output terminal providing a voltage level shift between the input terminal and the output terminal, and a feedback resistor. The photo diode receives a light signal producing a photo current, and the feedback resistor is electrically coupled to the input terminal and the output terminal of the first amplifier. The photo diode is also electrically coupled to the input terminal and the output terminal of the second amplifier, and the input terminal of the second amplifier is electrically coupled to the input terminal of the first amplifier. The first amplifier produces an output voltage proportional to the photo current.

Another embodiment is directed to a pseudo differential photo receiver circuit comprising a first photo diode and a second photo diode, a first amplifier having an inverting input terminal, a noninverting input terminal, an inverting output terminal, and a noninverting output terminal, a second amplifier having an input terminal and an output terminal providing a voltage level shift between the input terminal and the output terminal, and a first feedback resistor and a second feedback resistor. The first photo diode receives a light signal producing a photo current, and the feedback resistor is electrically coupled to the inverting input terminal and the noninverting output terminal of the first amplifier. The first photo diode is also electrically coupled to the input terminal and the output terminal of the second amplifier, and the input terminal of the second amplifier is electrically coupled to the input terminal of the first amplifier. The first amplifier produces an output voltage proportional to the photo current.

It should be appreciated that all combinations of the present concepts and additional concepts discussed in greater detail below (provided such concepts are not mutually inconsistent) are contemplated as being part of the inventive subject matter disclosed herein. In particular, all combinations of described subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

IN THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 1 (prior art) provides an illustration of a prior art photo receiver circuit.

FIG. 2 (prior art) provides an illustration of a prior art photo receiver circuit with a transimpedance amplifier.

FIG. 3 illustrates an example of a photo receiver circuit according to one embodiment of the present invention with a level shifting amplifier.

FIG. 4 (prior art) provides an illustration of a prior art photo receiver circuit with a transimpedance amplifier with a second parasitic capacitance.

DETAILED DESCRIPTION

Figure 1:
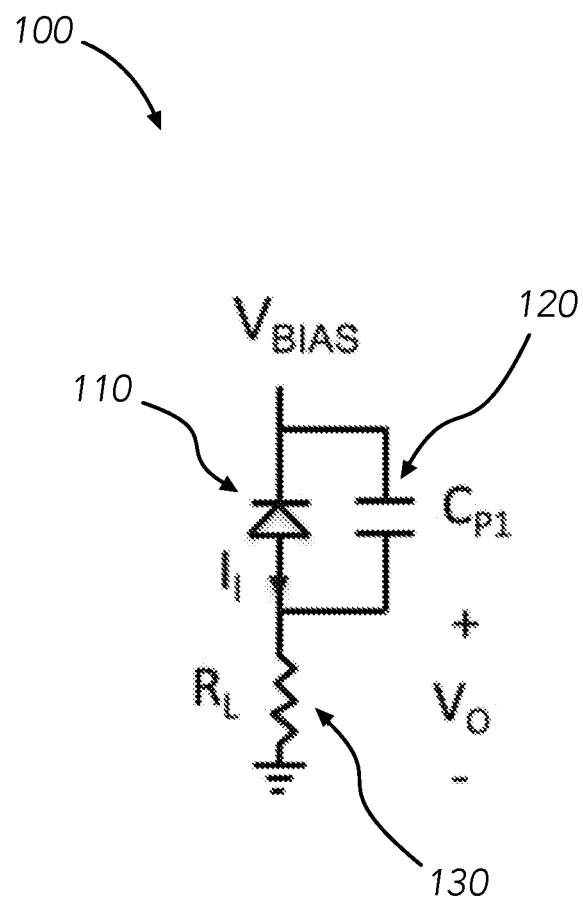
Figure 2:
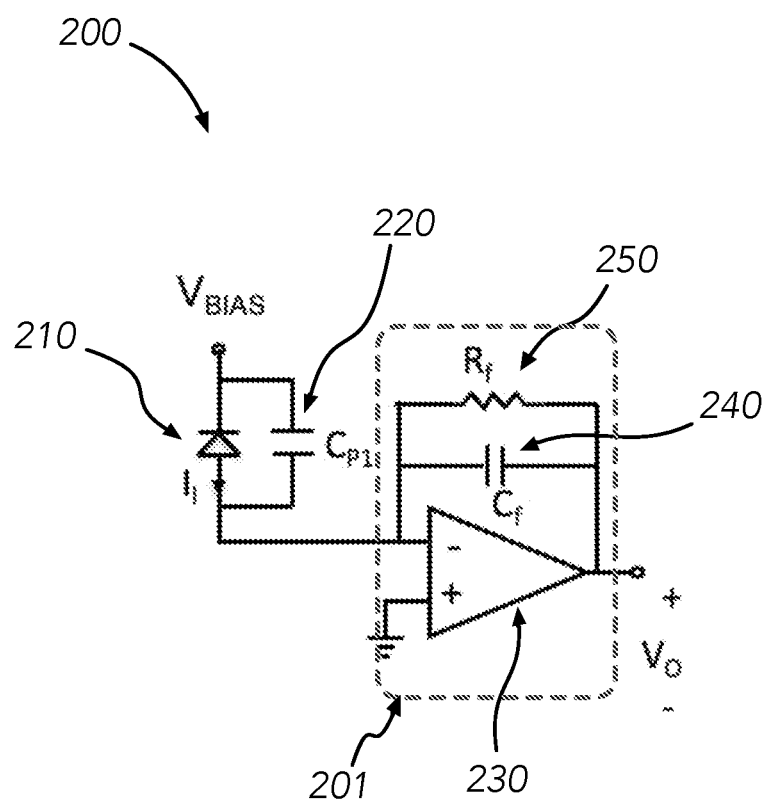

As mentioned earlier, conventional photo receiver circuits exist, and some examples of these are given, e.g., in FIGS. 1 and 2.

The photo receiver circuit 100 of FIG. 1 converts the photo current from a photodiode 110 into a voltage signal. The photodiode 110 is reverse biased by a bias voltage $V_{BIAS}$. The photocurrent $I_I$ flows into a load resistor $R_L$ (130) generating an output voltage $V_O$ such that $$V_O = I_I R_L \tag{1}$$

The transimpedance $R_T$ of the circuit is defined as the ratio between the output voltage $V_O$ and the input current $I_I$ such that $$R_T = \frac{V_O}{I_1} = R_L \tag{2}$$

As the signal frequency increases, the photo current begins to be diverted to the parasitic capacitance $C_{P1}$ (120), reducing the output voltage.

$$V_O = \frac{I_1 \cdot R_L}{1 + j\omega R_L C_{p1}} \tag{3}$$

The frequency where the magnitude of the output voltage drops 3 dB from the low frequency value is defined as a "signal bandwidth". From Equation (3), it can be shown that the signal bandwidth $\omega_h$ (in radians/second) is $$\omega_h = \frac{1}{R_L C_{p1}} \tag{4}$$

or, in Hz, $$f_h = \frac{1}{2\pi R_L C_{p1}} \tag{5}$$

In a lidar system, as an example, the photo current is usually small, e.g., less than 1 µA. In order to generate a high enough output voltage, typical $R_L$ values may be on the order of 10 kΩ so that a 10 mV voltage signal is obtained from the 1 µA photo current. With a typical value of 2 pF for $C_{p1}$, the resulting signal bandwidth is only 8 MHz. However, in lidar systems, 150 MHz or higher signal bandwidth is desired for sufficient distance resolution.

In FIG. 2, another conventional photo receiver circuit 200 employing a transimpedance amplifier is illustrated. The transimpedance amplifier 201 comprises an op amp 230, a feedback resistor $R_f$ (250), and a feedback capacitor $C_f$ (240). At low frequencies, assuming the op amp is ideal, the output voltage is proportional to the photo current and is given by $$V_O = -I_I R_f \tag{6}$$

The transimpedance of the circuit 200 is then $$R_T = \frac{V_O}{I_1} = -R_f \tag{7}$$

For a transimpedance of 10 kΩ, $R_f$=10 kΩ.

The feedback capacitor $C_f$ (240) is used for stability of the feedback loop. The frequency dependent output voltage is $$V_O = -\frac{I_1 \cdot R_f}{1 + j\omega R_f C_f} \tag{8}$$

The corresponding signal bandwidth is then $$f_h = \frac{1}{2\pi R_f C_f} \tag{9}$$

For $R_f$=10 kΩ, by making $C_f$=0.1 pF, 160 MHz signal bandwidth is achieved.

In an aspect, the bandwidth of the feedback loop is made substantially higher than the signal bandwidth so that it does not affect the signal bandwidth. At high frequencies, $C_f$ dominates over $R_f$, and the feedback factor β of the feedback loop is approximately $$\beta = \frac{C_f}{C_p + C_f} \tag{10}$$

The bandwidth of the loop $\omega_{loop}$ is then $$\omega_{loop} = \beta \omega_1 = \frac{C_f}{C_p C_f} \omega_1 \tag{11}$$

where $\omega_1$ is the unity-gain bandwidth of the op amp.

For $C_p$=2 pF and $C_f$=0.1 pF, $$\omega_{loop} = \frac{\omega_1}{21} \tag{12}$$

For the loop bandwidth to be much larger than the signal bandwidth of 160 MHz, the unity gain bandwidth $f_1$ (in Hz) of the op amp must be substantially higher than 21×160 MHz=3.36 GHz. Such an op amp would consume a large amount of power.

Another problem with conventional circuits such as the photo receiver circuit in FIG. 2 is the output noise due to the noise of the op amp 230. In an op amp, the high bandwidth and high gain requirement together with the stability required under feedback generally necessitate complicated circuitry with many transistors that contribute input referred noise. For the circuit in FIG. 2, the transfer function from the op amp input voltage noise to the output, referred to as 'noise gain' is given by $$G_{nop}(\omega) = 1 + \frac{j\omega R_f C_{p1}}{1 + j\omega R_f C_f} \tag{13}$$

The total in-band mean square noise at the output is then $$\overline{v_{on}^2} = \int_0^{f_h} |G_{nop}(f)|^2 S_{op}(f) \tag{14}$$

where $S_{op}$ is the input referred noise spectral density of the op amp.

In the signal band, $f<f_h$, thus $G_{nop}(f)$ can be approximated $$G_{nop}(f) = 1 + \frac{j2\pi f R_f C_{p1}}{1 + j2\pi f R_f C_f} \approx 1 + j2\pi f R_f C_{p1} \quad (15)$$

Assuming only white noise, it can be shown that $$\overline{v_{on}^2} \approx \left\{1 + \frac{1}{3} \cdot \left(\frac{C_{p1}}{C_f}\right)^2\right\} S_{op}(f) f_h \quad (16)$$

Typically, the noise spectral density $S_{op}(f)$ of the op amp is high, because there are a number of transistors that contribute noise in an op amp structure, resulting in high in-band noise. In order to lower op amp noise spectral density $S_{op}(f)$, thus the mean-square noise $\overline{v_{on}^2}$, power consumption and the area of the op amp is increased accordingly.

Figure 3:
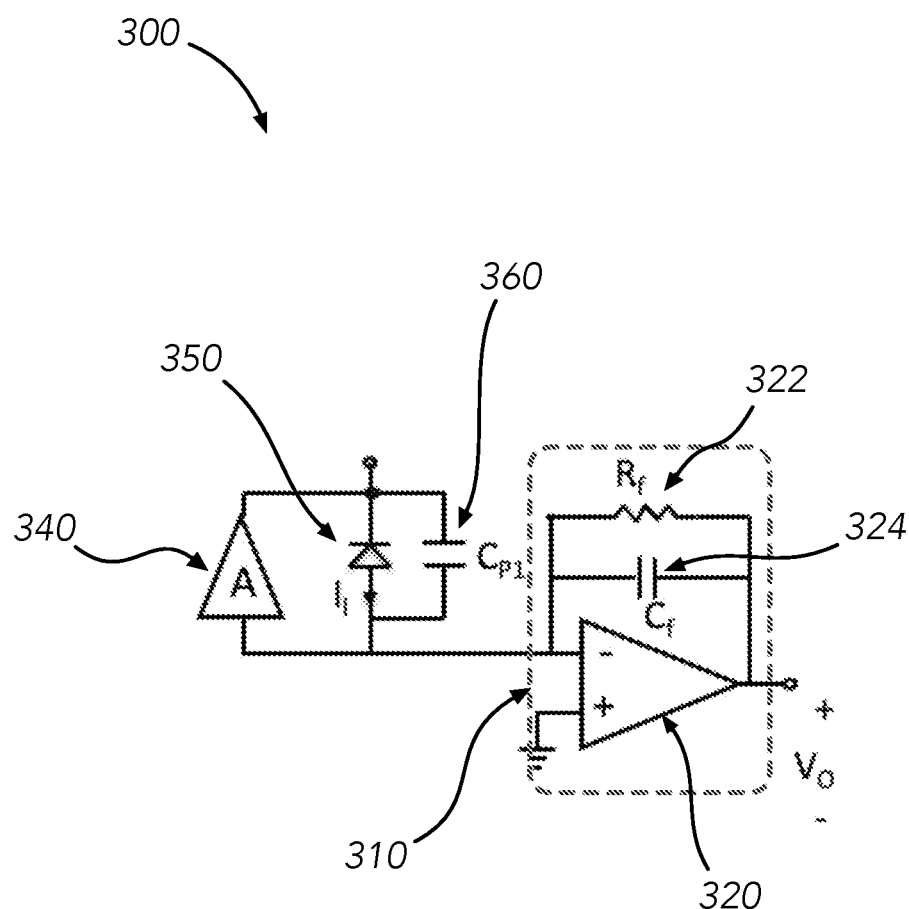

FIG. 3 illustrates an exemplary photo receiver circuit 300 according to the present invention. A DC level shifting amplifier 340 and photodiode 350 are connected in parallel, with the output terminal of the amplifier 340 and the cathode terminal of the photodiode 350 connected together, and the input terminal of amplifier 340 and the anode terminal of photodiode 350 connected to the inverting input of the transimpedance amplifier 310. The level shifting amplifier 340 in this example is a noninverting amplifier with a DC level shift of $V_{BIAS}$ between its input and the output in such way that the output voltage is higher than the input voltage by approximately $V_{BIAS}$. The photodiode 350 is reverse biased by the level shift $V_{BIAS}$. For simplicity, we may assume that the gain of the level shifting amplifier 340 is unity. In practice, the gain of amplifier 340 may be greater than unity, which can be advantageous in some practical embodiments. If the gain of the amplifier 340 is unity, it bootstraps the parasitic capacitance $C_{p1}$ (360), i.e., nulling or removing the effect of $C_{p1}$ (360) by keeping the voltage difference between its terminals constant.

Feedback capacitor $C_f$ (324) is used for stability of the feedback loop containing feedback resistor 322 in the transimpedance amplifier 310. However, $C_f$ can be made significantly smaller than that in the prior art examples (e.g., FIG. 2). The frequency dependent output voltage is shown to be $$V_O = -\frac{I_1 \cdot R_f}{1 + j\omega R_f C_f} \quad (17)$$

The corresponding signal bandwidth is then $$f_h = \frac{1}{2\pi R_f C_f} \quad (18)$$

For $R_f=10$ k$\Omega$, by making $C_f=0.02$ pF, 800 MHz signal bandwidth is achieved, which is five times higher than that of a conventional circuit of FIG. 2.

It should be understood that the specific examples and illustrations provided herein are exemplary and not limiting. The particular elements of the figures illustrating the embodiments of the invention may have other values and arrangements than the illustrative ones given herein without loss of generality. Also, additional or equivalent elements may be employed as best suits a given application, and those skilled in the art will appreciate that these variations are comprehended by this disclosure and claims.

In an aspect, the bandwidth of the feedback loop of transimpedance amplifier 310 can be substantially higher than the signal bandwidth so that it does not affect the signal bandwidth, which is the frequency at which the amplitude of the output voltage drops by 3 dB, as discussed earlier. Since the parasitic capacitor $C_{p1}$ is bootstrapped by the level shifting amplifier 340, the op amp 320 has unity gain feedback at all frequencies. Thus, the feedback factor $\beta$ of the feedback loop is unity, i.e., $$\beta = 1 \quad (19)$$

The bandwidth of the loop $\omega_{loop}$ is then $$\omega_{loop} = \omega_1 \quad (20)$$

where $\omega_1$ is the unity-gain bandwidth of the op amp.

For the loop bandwidth to be substantially larger than the signal bandwidth of 800 MHz in our example, the unity gain bandwidth $f_1$ (in Hz) of the op amp must be made much higher than 800 GHz. Even at five times higher signal bandwidth, the op amp unity gain bandwidth requirement is more than four times smaller compared with the conventional circuit of FIG. 2.

We emphasize again that the illustrative values and examples presented are for the sake of explanation, and any preferred embodiments or examples are not limiting of the invention, as would be appreciated by one of skill in the art.

The embodiments described herein (e.g., FIG. 3 and similar examples) also provide lower noise than in conventional circuits. The transfer function from the op amp input voltage noise to the opamp output is unity, or $$G_{nop}(\omega) = 1 \quad (21)$$

The total in-band mean square noise at the output due to the op amp 320 is then $$\overline{v_{on,op}^2} = \int_0^{f_h} |G_{nop}(f)|^2 S_{op}(f) \quad (22)$$

Assuming only the white noise, the output noise due to the op amp is $$\overline{v_{on,op}^2} \approx S_{op}(f) f_h \quad (23)$$

This is lower by a factor of $$1 + \frac{1}{3} \cdot \left(\frac{C_{p1}}{C_f}\right)^2$$

than that in the conventional circuit of FIG. 2.

Since the level shifting amplifier 340 also introduces noise, its effect to the output noise must be considered. The transfer function from the level shifting amplifier noise to the output is given by $$G_{nls}(\omega) = \frac{j\omega R_f C_{p1}}{1 + j\omega R_f C_f} \quad (24)$$

In the signal band, $f<f_h$, $G_{nls}(f)$ can be approximated as $$G_{nls}(f) \approx j2\pi f R_f C_{p1} \quad (25)$$

The total in-band mean square noise at the output due to the level shifting amplifier is then $$\overline{v_{on,ls}^2} = \int_0^{f_h} |G_{ls}(f)|^2 S_{ls}(f) \quad (26)$$

where $S_{ls}(f)$ is the noise spectral density of the level shifting amplifier referred to its own input.

Assuming only the white noise, $$\overline{V_{on,ls}^2} \approx \frac{1}{3} \cdot \left(\frac{C_{p1}}{C_f}\right)^2 S_{ls}(f) f_h \quad (27)$$

The total mean square noise at the output of the transimpedance amplifier is the sum of the op amp mean square noise (Eqn. 22) and the level shifting amplifier mean square noise (Eqn. 27), and is given by $$\overline{v_{on}^2} \approx \left\{ S_{op}(f) + \frac{1}{3} \cdot \left(\frac{C_{p1}}{C_f}\right)^2 S_{ls}(f) \right\} f_h \quad (28)$$

Since the level shifting amplifier 340 has a simpler design than an op amp, typically $S_{ls}(f) \ll S_{op}(f)$. Therefore, the noise of the circuit in FIG. 3 is substantially lower than that in the circuit in the conventional circuit of FIG. 2 or similar circuits for the same signal bandwidth.

Figure 4:
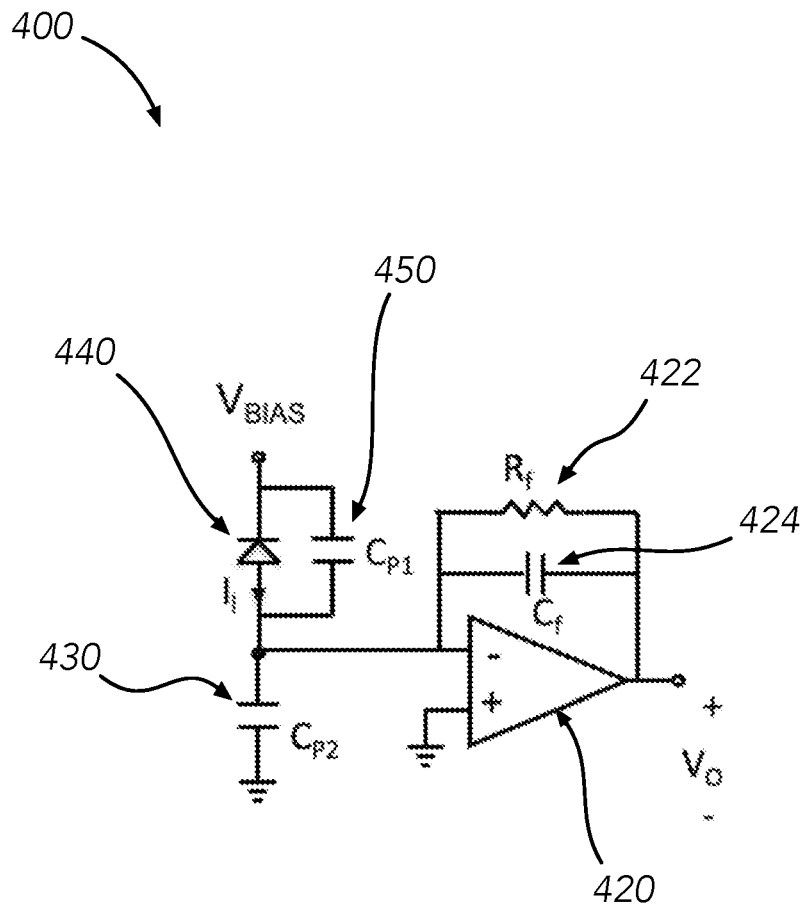

FIG. 4 shows another conventional circuit 400 having an additional non-negligible parasitic capacitance $C_{p1}$ (430) between the anode of the photo diode 440 and ground. This parasitic capacitance 430 may be due to printed circuit (PC) board traces and the input capacitance of the op amp 420. The parasitic capacitance 430 increases the noise gain of the op amp 420 to $$G_{nop}(\omega) = 1 + \frac{j\omega R_f (C_{p1} + C_{p2})}{1 + j\omega R_f C_f} \approx 1 + j2\pi f R_f (C_{p1} + C_{p2}) \quad (29)$$

The output mean-square noise is increased to $$\overline{v_{on}^2} \approx \left\{ 1 + \frac{1}{3} \cdot \left(\frac{C_{p1} + C_{p2}}{C_f}\right)^2 \right\} S_{op}(f) f_h \quad (30)$$

Figure 5:
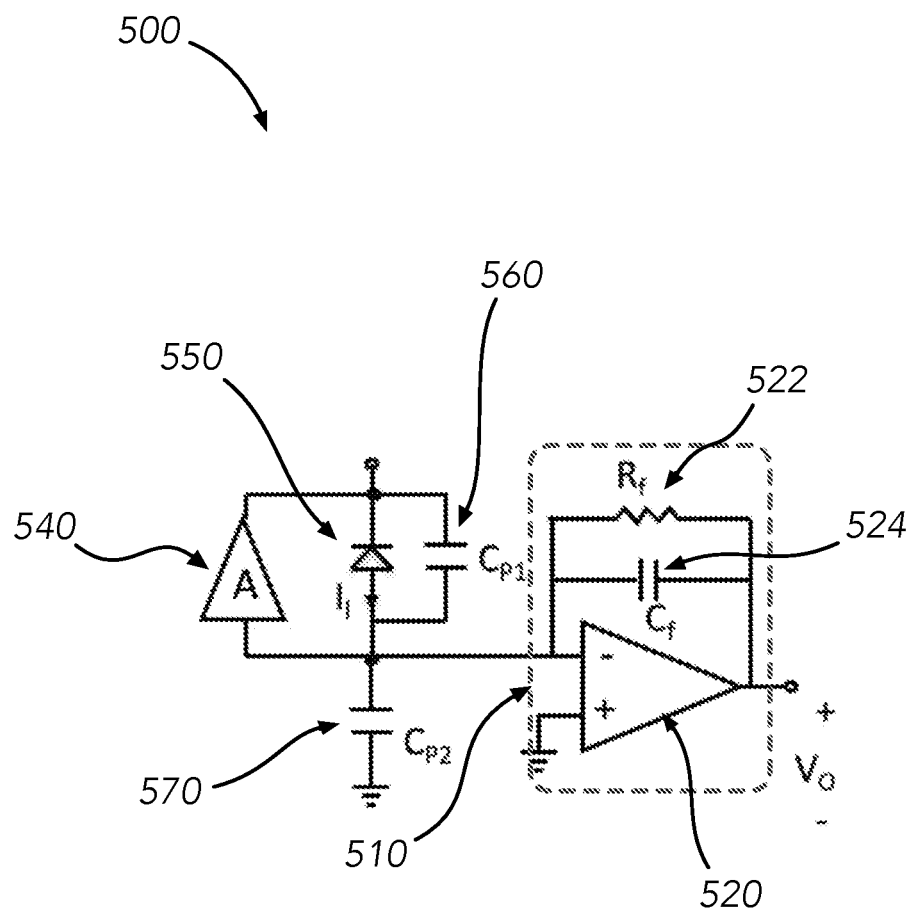
FIG. 5 illustrates an example of a photo receiver circuit with a second parasitic capacitance according to another embodiment of the present invention.

FIG. 5 illustrates another exemplary embodiment 500 of the present invention, wherein the parasitic capacitance $C_{p2}$ (570) increases the op amp (520) noise gain to $$G_{nop}(\omega) = 1 + \frac{j\omega R_f C_{p2}}{1 + j\omega R_f C_f} \approx 1 + j2\pi f R_f C_{p2} \quad (31)$$

The corresponding output mean-square noise is then $$\overline{v_{on,op}^2} \approx \left\{ 1 + \frac{1}{3} \cdot \left(\frac{C_{p2}}{C_f}\right)^2 \right\} S_{op}(f) f_h \quad (32)$$

Therefore, if the parasitic capacitance $C_{p2}$ approaches the value of the feedback capacitor $C_f$ (524), the output mean-square noise due to the op amp will increase appreciably. The total output mean square noise becomes $$\overline{v_{on}^2} \approx \left[ \left\{ 1 + \frac{1}{3} \cdot \left(\frac{C_{p2}}{C_f}\right)^2 \right\} S_{op}(f) + \frac{1}{3} \cdot \left(\frac{C_{p1}}{C_f}\right)^2 S_{ls}(f) \right] f_h \quad (33)$$

Since $S_{ls}(f) \ll S_{op}(f)$, the noise of the circuit in FIG. 5 is substantially lower than that in the circuit in the conventional circuit of FIG. 4. The noise can be further improved by increasing the gain A of the level shifting amplifier 540 to a value larger than unity to eliminate the op amp noise gain increase due to $C_{p2}$. If the gain A is increased to $$A = 1 + \frac{C_{p2}}{C_{p1}} \quad (34)$$

then it can be shown that the op amp noise gain is back to unity as in the case with $C_{p2}=0$. However, the increased amplifier gain increases noise gain from the level shifting amplifier 540

$$G_{nls}(f) \approx jA2\pi f R_f C_{p1} = j\left(1 + \frac{C_{p2}}{C_{p1}}\right) 2\pi f R_f C_{p1} \quad (35)$$

The corresponding output mean square noise is $$\overline{v_{on,ls}^2} \approx \frac{1}{3} \cdot \left(\frac{C_{p1} + C_{p2}}{C_f}\right)^2 S_{ls}(f) f_h \quad (36)$$

and the total output mean square noise is $$\overline{v_{on}^2} \approx \left\{ S_{op}(f) + \frac{1}{3} \cdot \left(\frac{C_{p1} + C_{p2}}{C_f}\right)^2 S_{ls}(f) \right\} f_h \quad (37)$$

Since $S_{ls}(f) \ll S_{op}(f)$, the noise in the photoreceiver circuit 500 is still substantially less than that in the conventional circuit of FIG. 4 given in Equation (30).

As stated, the present circuits will vary in their specific designs and in the values of the circuit elements therein, according to the application for which a given circuit is to be used, and other factors. All such embodiments are considered within the scope of the invention and appended claims.

Figure 6:
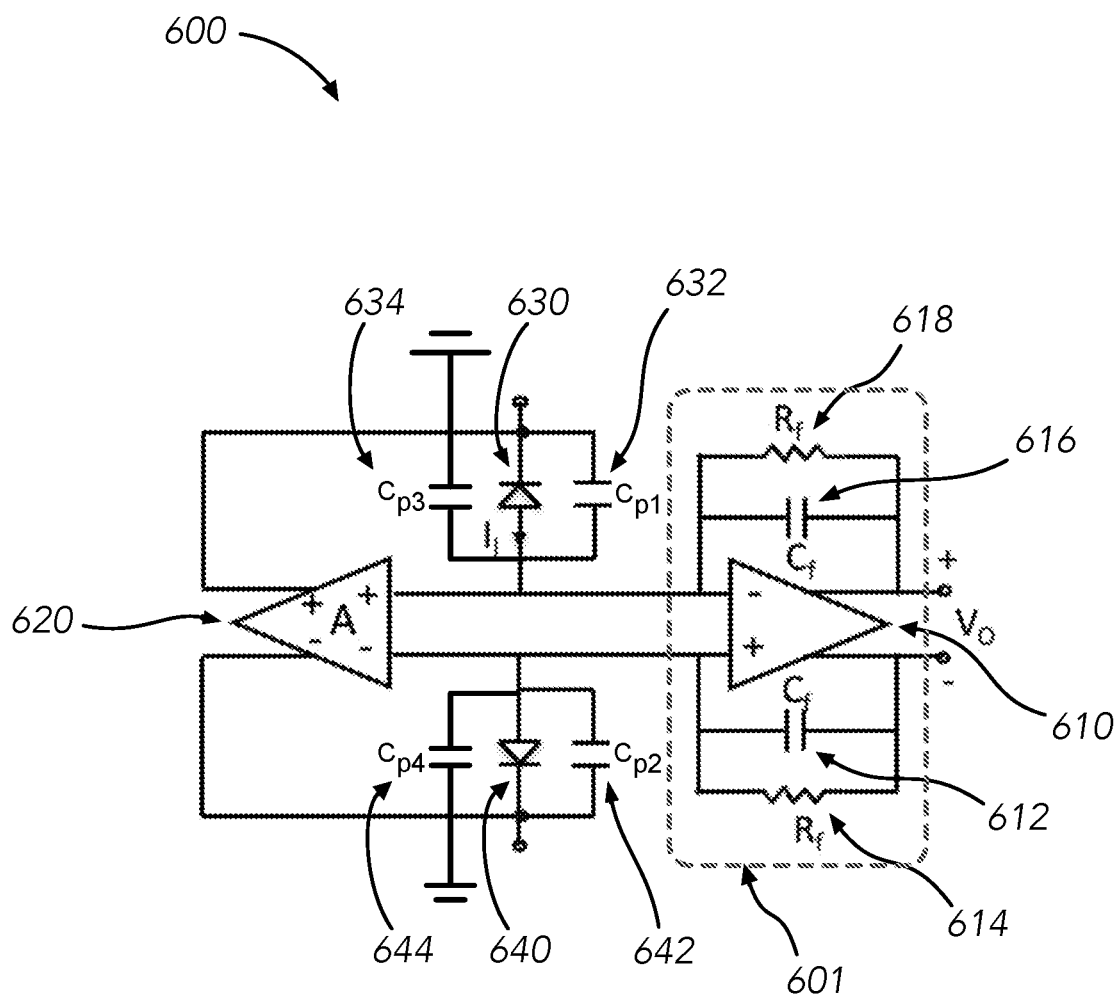
FIG. 6 illustrates an example of a pseudo differential photo receiver circuit with a differential level shifting amplifier according to another embodiment of the present invention.

FIG. 6 illustrates another embodiment of a photo detector circuit 600 according to the present invention. This example includes a pseudo-differential circuit and is useful especially in applications where high power supply and common-mode rejection are required. A symmetric feedback network 601 comprising feedback resistors 614 and 618, feedback capacitors 612 and 616 are coupled to a fully-differential op amp 610. A dummy or inactive photodiode 640, which does not receive light and/or is not responsive to light, is positioned symmetrically with a functioning or active photodiode 630. The dummy photodiode or sensor 640 may output a constant output signal rather than actually being dependent on an incident light. In some examples, a light-blocking barrier is placed on the light-sensitive area of the dummy photodiode 640 so as to prevent light from affecting the dummy diode 640. In other embodiments, dummy photodiode 640 is disposed within the package of the apparatus such that the package or other components thereof prevent light from passing to the active area of photodiode 640. In yet other instances, the dummy photodiode 640 has its light-sensing portions disabled so as to be non-functional during use. A fully-differential level shifting amplifier 620 provides level shifting to reverse bias the photodiode 630 and the dummy photodiode 640. The operating principle of the photoreceiver circuit 600 is similar to the single-ended photoreceiver circuits 300 and 500 shown in FIGS. 3 and 5.

The parasitic capacitance $C_{p1}$ includes the reverse-biased junction capacitance of the active photodiodes in the present embodiments. The parasitic capacitance $C_{p2}$ includes the reverse-biased junction capacitance of the dummy photodiodes in the present embodiments. Typically, the junction capacitance becomes smaller at a larger reverse bias voltage. In one or more embodiments, we make the biasing voltage $V_{BIAS}$ in FIGS. 3 and 5 as large as possible without risking device breakdown. In the circuit in FIG. 3 and FIG. 5, the reverse bias is provided by the level shifting amplifiers. Due to the possible breakdown of devices inside the level shifting amplifiers, the amount of level shift can be limited, especially in integrated circuits.

Figure 7:
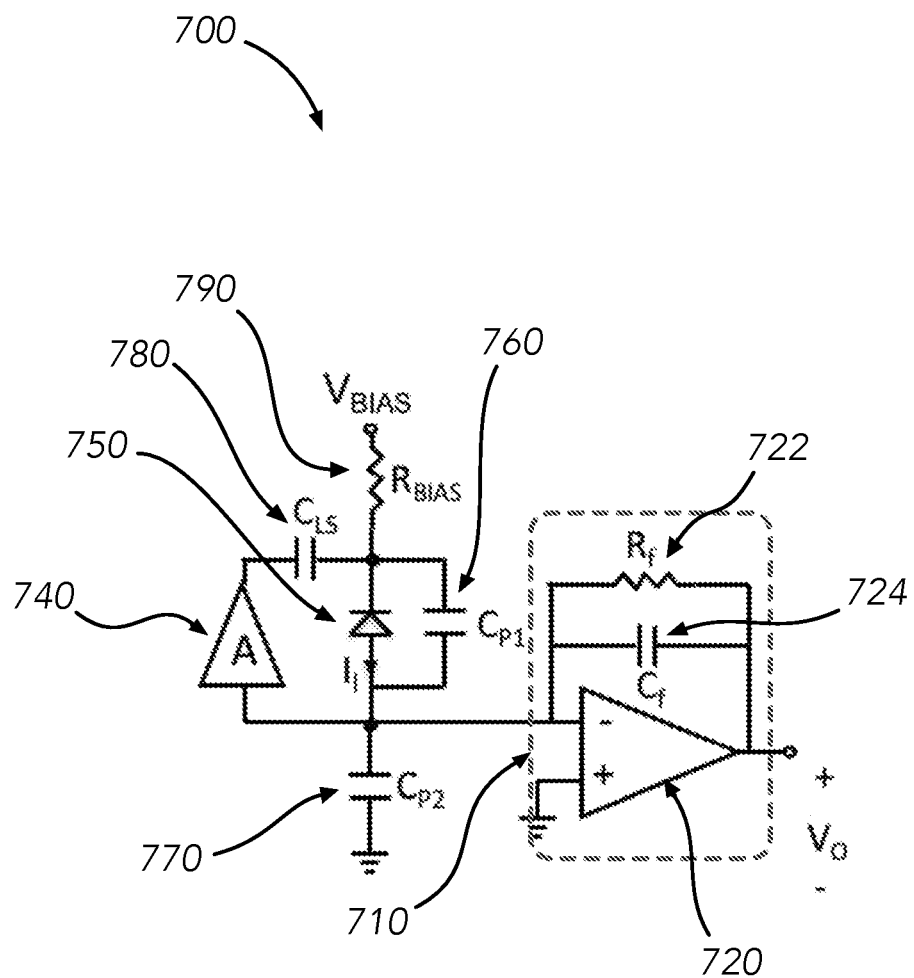
FIG. 7 illustrates an example of photo receiver circuit according to another embodiment of the present invention, which further includes an additional level shifting circuit implemented by a resistor and a capacitor.

FIG. 7 illustrates yet another example of a photo sensing circuit 700 according to the present invention. The reverse bias across the photodiode 750 is increased beyond the level shift provided by the level shifting amplifier 740 by the resistor $R_{BIAS}$ and the capacitor $C_{LS}$. Assuming the voltage drop across $R_{BIAS}$ due to the photo current is small, the DC voltage at the cathode of the photodiode 750 is at $V_{BIAS}$. The level shifting capacitor as absorbs the voltage difference between $V_{BIAS}$ and the DC output level of the level shifting amplifier 740. Thus, $V_{BIAS}$ can be made substantially larger than the devices in the level shifting amplifier 740 can tolerate. Since the output of the level shifting amplifier 740 is AC coupled to the cathode of the photodiode 750, the bootstrapping effect of the amplifier 740 is effective in the signal band by making the RC time constant $R_{BIAS}C_{LS}$ longer than the minimum signal frequency.

Figure 8:
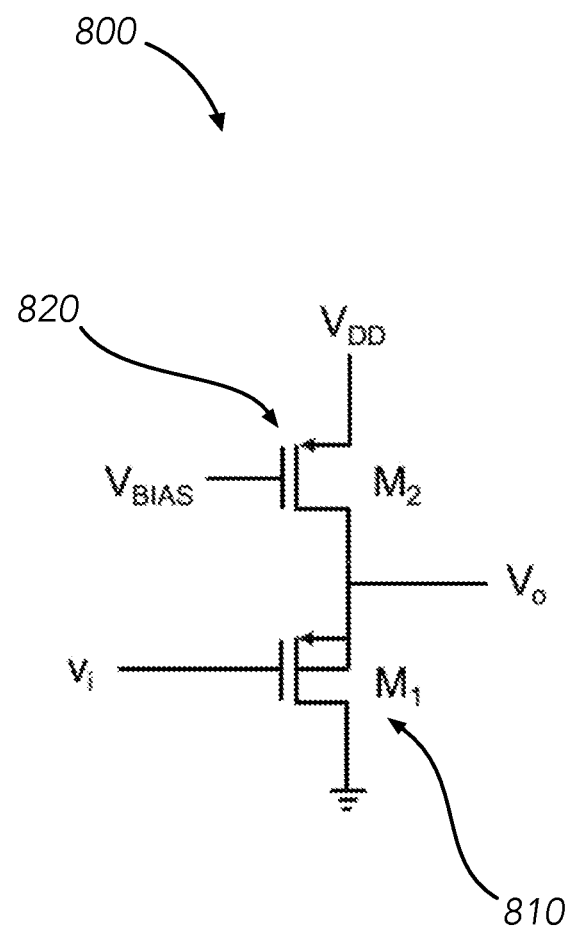
FIG. 8 illustrates a source-follower circuit as an example of a level shifting amplifier.

FIG. 8 illustrates an exemplary embodiment of a level shifting amplifier 800, which is a source-follower amplifier, and which can be used in the present circuits as described above. The level shift is determined by the gate-to-source voltage of the transistor 810. The gain of the amplifier 800 is slightly less than unity due to the body effect of transistor 810 and the finite output resistance of both transistors 810 and 820.

Figure 9:
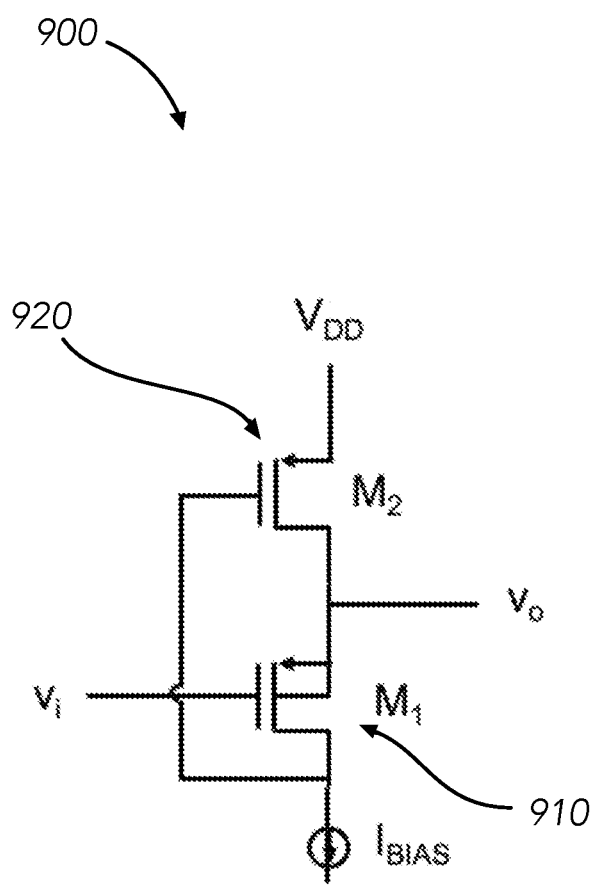
FIG. 9 illustrates a "flipped" source-follower circuit as another example of a level shifting amplifier.

FIG. 9 illustrates another exemplary embodiment of a level shifting amplifier, wherein amplifier 900 comprises a "flipped voltage follower" with transistors 910, 920. Compared with the amplifier 500 in FIG. 8, the amplifier 900 provides gain closer to unity, and much lower output resistance. The level shift is determined by the gate-to-source voltage of the transistor 910.

Figure 10:
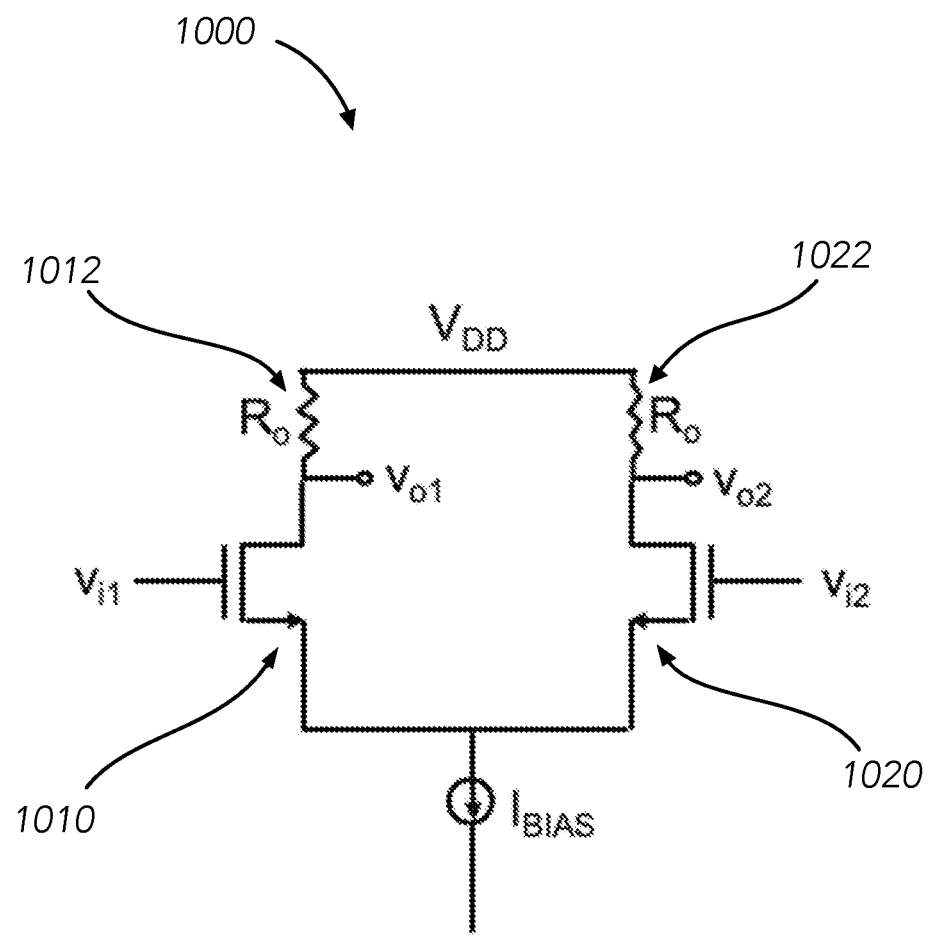
FIG. 10 illustrates a differential amplifier as another example of a level shifting amplifier.

FIG. 10 illustrates yet another example of a differential level shifting amplifier 1000 that can be used in the present circuits. Here, the amplifier 1000 can be used as a level shifting amplifier for both the single-ended photo receiver circuits of FIGS. 3 and 5 as well as the pseudo-differential photo receiver circuit of FIG. 6, and others. For use in single-ended photo receiver circuits, a non-inverting relation between the input and the output of the level shifting amplifier 1000 may be selected. For example, if the input $V_{i1}$ is chosen as the input of the amplifier 1000, the non-inverting output $V_{o2}$ can then be chosen as the output. In that case, the gain of the amplifier 1000 is given by $$A = \frac{g_m R_o}{2} \qquad (38)$$

where $g_m$ is the transconductance of the transistor 1010 (which is the same as that of the transistor 1020), and $R_o$ is the value of the resistors 1012 and 1022. The amount of level shift is $$V_{LS} = V_{DD} - \frac{I_{BIAS} R_o}{2} - V_I \qquad (39)$$

where $V_I$ is the DC common-mode level of the input voltages at the level shifting amplifier 1000.

The level shifting amplifier 1000 can be used as a differential level shifting amplifier 138 as shown in FIG. 6 and other embodiments. $V_{i1}$ and $V_{i2}$ are non-inverting and inverting inputs, respectively, and $V_{o1}$ and $V_{o2}$ are inverting and non-inverting outputs, respectively. The amount of level shift is the same as in a single-ended case given in Equation (39).

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. As a specific example, it may be desired to use PMOS input transistors in the amplifier circuits in FIGS. 8, 9 and 10 instead of the NMOS input transistors as shown in the exemplary figures. Such "flipped" configurations will be appreciated by those who are skilled in the art. It is, therefore, to be understood that the foregoing embodiments are presented by way of example only and that, within the scope of the appended examples and equivalents thereto, inventive embodiments may be practiced otherwise than as specifically described and described. Inventive embodiments of the present disclosure are directed to each individual feature, system, article, material, kit, and/or method described herein. In addition, any sensible combination of two or more such features, systems, articles, materials, kits, and/or methods, if such features, systems, articles, materials, kits, and/or methods are not mutually inconsistent, is included within the inventive scope of the present disclosure.

Also, the technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

I claim:
1. A photo receiver circuit, comprising:
 a photo sensor that provides an output signal responsive to a light incident on said photo sensor;
 a first level shift amplifier having an input terminal and an output terminal coupled across said photo sensor, said level shift amplifier providing a voltage level shift between its input and output terminals, said voltage level shift providing a DC bias across the photo sensor; and a transimpedance amplifier having a first input terminal and a first output terminal;

wherein the transimpedance amplifier provides a first output voltage at the first output terminal corresponding to said photo sensor output signal.

2. The circuit of claim 1, said photo sensor comprising a photodiode, and said photo sensor output signal comprising a photocurrent output signal of said photodiode.

3. The circuit of claim 1, said photo sensor comprising a photoresistor and said photo sensor output comprising a resistance of said photoresistor.

4. The circuit of claim 1, said transimpedance amplifier comprising an operational amplifier having a first input terminal and a first output terminal.

5. The circuit of claim 1, said transimpedance amplifier comprising a feedback resistor between the first input and the first output terminals of said transimpedance amplifier.

6. The circuit of claim 5, further comprising said feedback resistor and a feedback capacitor, connected in parallel between the first input and the first output terminals of said operational amplifier.

7. The circuit of claim 1, said level shift amplifier providing a DC voltage offset between respective input and output terminals of the level shift amplifier.

8. The circuit of claim 1, the level shift amplifier comprising a source follower.

9. The circuit of claim 1, the level shift amplifier comprising a flipped source follower.

10. The circuit of claim 1, the level shift amplifier comprising a differential amplifier having a voltage gain.

11. The circuit of claim 1, wherein the voltage gain of the differential amplifier cancels an effect of a parasitic capacitance from a feedback factor of the transimpedance amplifier.

12. A photo receiver circuit of claim 1, further comprising:
   a dummy photo sensor that provides a constant output signal;
   a second level shift amplifier comprising an input terminal and an output terminal coupled across the dummy photo sensor, said second level shift amplifier providing a voltage level shift between its respective input and output terminals, said voltage level shift providing a DC bias across the dummy photo sensor;
   the transimpedance amplifier further comprising a second input terminal and a second output terminal; and
   wherein the transimpedance amplifier provides a second output voltage between its first and second output terminals corresponding to said active photo sensor output signal.

13. The circuit of claim 12, said first feedback resistor and first feedback capacitor comprising a first feedback network of said transimpedance amplifier, and said second feedback resistor and second feedback capacitor comprising a second feedback network of said transimpedance amplifier, wherein the first and second feedback networks are substantially symmetrical across the respective input and output terminals of the transimpedance amplifier.

14. The circuit of claim 12, said active photo sensor comprising a photodiode and said photo sensor output signal comprising a photocurrent output signal of said photodiode.

15. The circuit of claim 12, said active photo sensor comprising a photoresistor and said active photo sensor output comprising a resistance of said photoresistor.

16. The circuit of claim 12, the level shift amplifier comprising a source follower.

17. The circuit of claim 12, the level shift amplifier comprising a flipped source follower.

18. The circuit of claim 12, the level shift amplifier comprising a differential amplifier having a voltage gain.

19. The circuit of claim 18, wherein the voltage gain of the differential amplifier cancels an effect of a parasitic capacitance from a feedback factor of the transimpedance amplifier.

20. The circuit of claim 12 said transimpedance amplifier comprising:
   a first feedback resistor coupled to the first input and the first output terminals of the transimpedance amplifier; and
   a second feedback resistor coupled to the second input and the second output terminals of the transimpedance amplifier.

21. The circuit of claim 20 said transimpedance amplifier comprising:
   a first feedback capacitor coupled to the first input and the first output terminals of the transimpedance amplifier; and
   a second feedback capacitor coupled to the second input and the second output terminals of the transimpedance amplifier.

* * * * *